United States Patent [19]

Gaddy

[11] Patent Number: 5,006,179
[45] Date of Patent: Apr. 9, 1991

[54] INTERCONNECT FOR ELECTRICALLY CONNECTING SOLAR CELLS

[75] Inventor: Edward M. Gaddy, Potomac, Md.
[73] Assignee: Solarex Corporation, Frederick, Md.
[21] Appl. No.: 356,208
[22] Filed: May 24, 1989
[51] Int. Cl.$^5$ .............................................. H01L 31/05
[52] U.S. Cl. .................................. 136/244; 439/81; 439/382; 439/449; 439/474
[58] Field of Search ................ 136/244; 439/81, 382, 439/449, 474

[56] References Cited

U.S. PATENT DOCUMENTS 3,330,700  7/1967  Golub et al. ..................... 136/244
4,193,820  3/1980  Thomas ............................ 136/244

OTHER PUBLICATIONS

J. D. Gum, Conference Record, IEEE Photovoltaic Specialists Conference (1968), pp. 234-242.

Primary Examiner—Aaron Weisstuch
Attorney, Agent, or Firm—Finnegan, Henderson, Farabow, Garrett & Dunner

[57] ABSTRACT

An interconnect for electrically connecting adjacent solar cells disposed in a solar cell array is disclosed. The interconnect is comprised of three parts: an elongated stress relief part disposed substantially parallel to adjacent side edges of the solar cells which are electrically connected by the interconnect; a first connecting part joined to a first end portion of the stress relief part and to the electrical contact of the first solar cell; and a second connecting part joined to the opposite end portion of the stress relief part and to the electrical contact of the adjacent solar cell. In this manner, stress induced in the interconnect as a result of thermal cycling of the solar cells electrically connected by the interconnect is significantly reduced as compared to prior art configurations to thereby increase the survivability and expected life of the interconnect. In addition, the removal and replacement of the connected solar cells is facilitated.

11 Claims, 3 Drawing Sheets

INTERCONNECT FOR ELECTRICALLY CONNECTING SOLAR CELLS

BACKGROUND OF THE INVENTION

1. Field of the Invention

The present invention relates to solar cells and arrays of such solar cells, and more particularly to interconnects for electrically connecting a first solar cell to a second solar cell or to a terminal in a solar cell array.

2. Description of the Related Art

Solar cell interconnects are used to electrically connect a first solar cell to a second solar cell or to a terminal in an array of solar cells. Such interconnects may be used to connect the solar cells of a solar cell array in either a parallel or a series configuration, or both. An array of solar cells interconnected in either series or parallel configuration is typically used to provide electric power to orbiting space vehicles such as satellites. One of the tasks which must be performed by an interconnect utilized in a solar cell array for an orbiting space vehicle is to absorb changes in the spacing between the cells of the array which result from severe thermal cycling encountered by orbiting spacecraft. Typically, an orbiting spacecraft is subjected to cyclical changes in temperature as great as 250° C. Such mechanical or thermal cycling of the interconnects causes stress concentration in the interconnect material and in the solar cell itself where the interconnect is attached to the solar cell.

FIG. 1 illustrates a typical interconnect arrangement used in a solar cell array for orbiting spacecraft. Such a prior art interconnect, generally referred to as 10, comprises a generally semicircular central loop portion 12 and two generally flat end portions 14 and 16 extending from either end of loop portion 12. End portion 14 of interconnect 10 is permanently attached to a bottom contact 18 of a first solar cell 20, and end portion 16 of interconnect 10 is permanently attached to a top contact 22 of an adjacent solar cell 24. Frequently end portion 16 is under the solar cell cover 25, which protects the cell from radiation, and which is fixed to the solar cell 24 with transparent adhesive 26. End portions 14 and 16 of interconnect 10 are typically attached to solar cells 20 and 24, respectively, by a weld or a solder bond. The solar cells 20 and 24 are typically bonded to a substrate 70 by a silicone adhesive 71.

When this assembly is subjected to thermal cycling the substrate and cells expand and contract in accordance with the coefficient of thermal expansion of the material comprising the substrate and the cells, and the resulting change in spacing between the cells is absorbed by flexing in loop portion 12. However, such flexing in loop portion 12 creates relatively high levels of stress concentrations in the material comprising loop portion 12 due to the configuration and orientation of the loop. Such repeated stress may lead to fracturing of the interconnect itself.

During thermal cycling, the weld or solder bonds, and the cell and interconnect areas adjacent to the bonds experience stress due to the difference of coefficients of thermal expansion of these materials. This creates relatively high levels of stress concentrations where end portions 14 and 16 are connected to solar cells 20 and 24. Such repeated stress concentration may lead to fracturing of the bonds, or fracturing of the solar cell or the interconnect at the attachment to end portions 14 and 16.

Such fracturing of the interconnect or of the solar cell is obviously highly disadvantageous particularly when the solar cell is disposed in an orbiting spacecraft. Furthermore, such prior art solar cell interconnects as illustrated in FIG. 1 partially lose their ability to expand and contract with thermal cycling if the loop is filled or partially filled with solar cell adhesive as may happen when the solar cell array is being assembled. Typically, because of the size and location of loop portion 12, it is relatively easy for adhesive to enter into the area immediately below loop portion 12. If this happens, experience has shown that the interconnect will fail prematurely.

Moreover, since space is obviously at a premium in orbiting spacecraft, it is desirable to dispose the solar cells comprising the array as close to one another as possible. Such close spacing of the solar cells decreases the tolerances which must be used in manufacturing interconnect 10, and particularly loop portion 12 of interconnect 10. Such tight tolerances present problems in the fabrication of the interconnects.

Furthermore, such prior art solar cell interconnects as illustrated in FIG. 1 make removal and replacement of a broken cell difficult. If solar cell 20 is broken, the cell is typically chipped off the substrate and removed piece by piece along with interconnect 10. Before this, the glass cover on top of interconnect end portion 16 is taken off the unbroken cell 24 so that the interconnect may be desoldered from cell 24. Removing the glass cover 25 inevitably breaks the cover and sometimes breaks the cell 24.

Therefore, it is an object of the present invention to provide a solar cell interconnect having an increased life expectancy when subjected to extended periods of severe thermal cycling.

It is a further object of the present invention to provide a configuration for a solar cell interconnect which is easy to manufacture and which does not require tight tolerances in the fabrication thereof.

It is a further object of the present invention to provide a solar cell interconnect which reduces stress concentrations during severe thermal cycling in the body of the interconnect and at the attachment of the interconnect to the solar cells.

It is a further object of the present invention to provide a solar cell interconnect which is configured to facilitate the removal and replacement of solar cells by permitting one part of the interconnect to be easily disconnected from another part, and by permitting a damaged cell to be replaced without removing the cover of an adjacent cell.

Additional objects and advantages of the invention will be set forth in the description which follows, and in part will be obvious from the description, or may be learned by practice of the invention. The objects and advantages of the invention may be realized and attained by means of the instrumentalities and combinations particularly pointed out in the appended claims.

SUMMARY OF THE INVENTION

To achieve the foregoing objects, and in accordance with the purposes of the invention as embodied and broadly described herein, an interconnect for electrically connecting first and second solar cells of a solar cell array is provided. The interconnect comprises an elongated stress relief part having a central portion and first and second end portions, a first connecting part for attachment to an upper contact of the first solar cell, and a second connecting part for attachment to the lower contact of the second solar cell. The interconnect further includes means for joining the first and second connecting parts to the end portions of the stress relief part such that the central portion of the stress relief part is disposed substantially parallel to adjacent edges of the first and second solar cells.

It is further preferable that the first and second connecting parts be formed of a material having a coefficient of thermal expansion substantially the same as the coefficient of thermal expansion of silicon so that as the solar cell array is thermally cycled, the respective solar cells expand and contract in conjunction with the expansion and contraction of the first and second connecting parts thereby substantially reducing any stress concentration at the points where the first and second connecting parts are attached to the contacts of adjacent solar cells.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

DESCRIPTION OF THE PREFERRED EMBODIMENT

Figure 1:
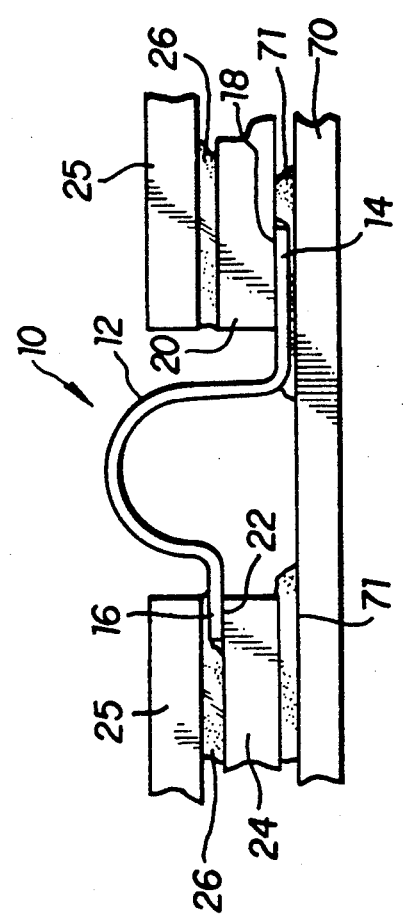
FIG. 1 is a side view of a typical prior art solar cell interconnect.

Reference will now be made in detail to the present preferred embodiment of the invention as illustrated in the accompanying drawings, in which like reference characters designate like or corresponding parts throughout the several drawings.

Figure 5:
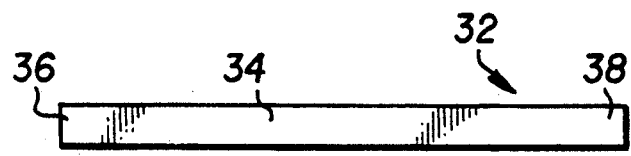
FIG. 5 is a top view of a stress relief part of a solar cell interconnect incorporating the teachings of the present invention.
Figure 6:
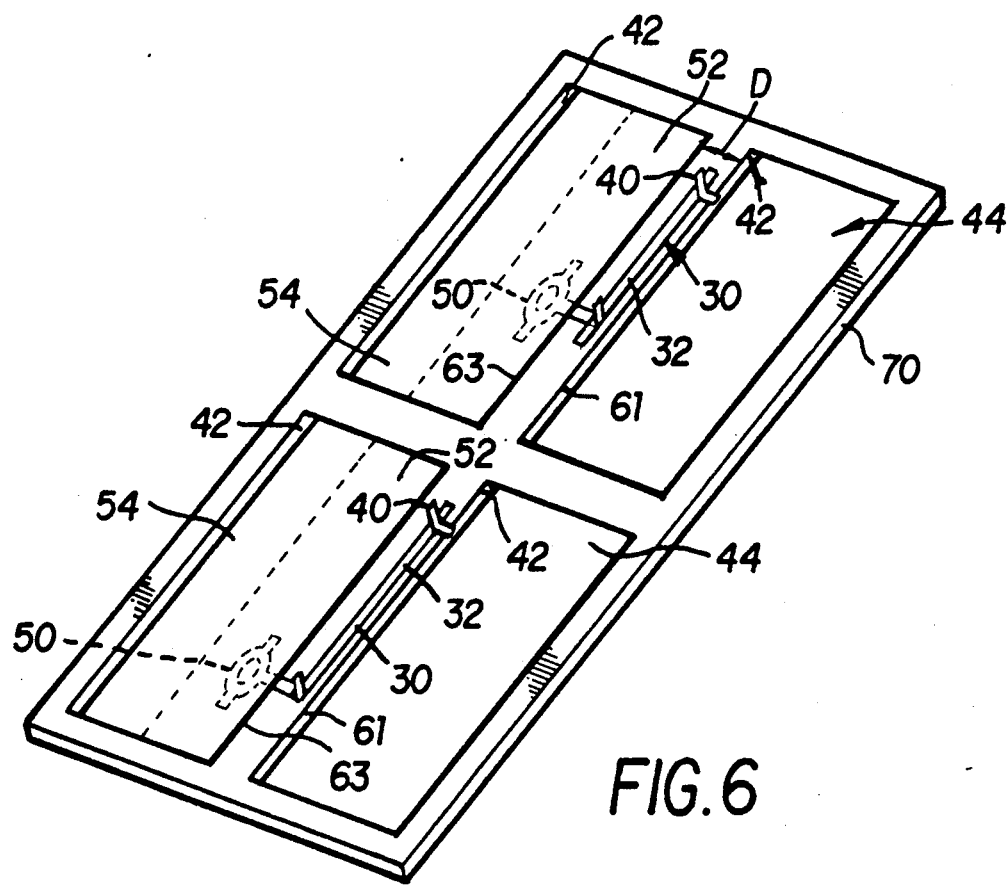
FIG. 6 is an isometric view of a solar cell array utilizing solar cell interconnects incorporating the teachings of the present invention.

In accordance with the present invention there is provided an interconnect for electrically connecting first and second solar cells to one another. With reference to FIG. 6, the interconnect is generally referred to as 30. Interconnect 30 includes an elongated stress relief part 32 shown in detail in FIG. 5. Stress relief part 32 includes a central portion 34 and first and second end portions 36 and 38, respectively.

Figure 2:
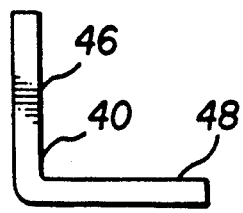
FIG. 2 is a side view of a first connecting part of a solar cell interconnect incorporating the teachings of the present invention.

With continued reference to FIG. 6, interconnect 30 includes a first connecting part 40 for attachment to an electrical contact 42 of a first solar cell 44. First connecting part 40 is illustrated in detail in FIG. 2 and includes proximal end portion 46 and distal end portion 48.

Figure 4:
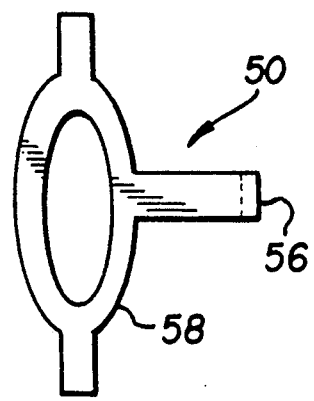
FIG. 4 is a top view of the second connecting part of FIG. 3.
Figure 3:
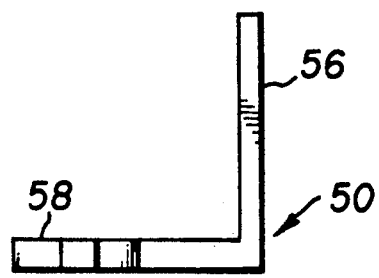
FIG. 3 is a side view of a second connecting part of a solar cell interconnect incorporating the teachings of the present invention.

Interconnect 30 further includes a second connecting part 50, illustrated in detail in FIGS. 3 and 4, for attachment to an electrical contact 52 of a second solar cell 54 disposed adjacent to first solar cell 44. Second connecting part 50 includes a proximal end portion 56 and a distal end portion 58. As best seen in FIG. 6, elongated stress relief part 32 is configured to extend substantially parallel to edges 61 and 63 of adjacent solar cells 44 and 54, respectively.

In accordance with the present invention, interconnect 30 further includes means for joining the first and second connecting parts to respective first and second end portions of the stress relief part. As embodied herein, the joining means may comprise a solder type bond which joins proximal end portion 46 of first connecting part 40 to first end portion 36 of stress relief part 32. Similarly, a solder type bond may be used to join proximal end portion 56 of second connecting part 50 to second end portion 38 of stress relief part 32. The solder type bond disclosed in the preferred embodiment of the present invention is shown by way of example and is not limitive of the scope of the present invention. As intended herein, the term joining encompasses any means for fixing first and second connecting parts 40 and 50 relative to stress relief part 32 such that current can pass through the first and second connecting parts and the stress relief part. Therefore, the joining means may also include a snap type fit between the stress relief part and the first and second connecting parts or even a substantially non-insulating adhesive bond which connects the first and second connecting parts to the stress relief part.

It is further preferable, although not required in the practice of the present invention, that whatever specific type of joining means is utilized should also function such that the first or second connecting part can be detached from the stress relief part without damaging the solar cells which are connected to the distal portions 48 and 58 of first and second connecting parts 40 and 50, respectively. In the preferred embodiment of the present invention, the solder type bond meets this functional requirement since the solder bond may be broken simply by applying heat to the solder to melt the solder material thereby permitting easy detachment of either the first or second interconnecting part from the stress relief part.

With reference to FIG. 6, distal end portions 48 and 58 of first and second connecting parts 40 and 50, respectively, are preferably configured to extend substantially perpendicularly from respective proximal portions 46 and 56 of the first and second connecting parts, in opposite directions relative to the stress relief part 32. In this manner, distal end portions 48 and 58 are disposed to be connected to electrical contacts 42 and 52 of adjacently disposed first and second solar cells 44 and 54 while concurrently positioning the stress relief part substantially parallel to the edges of the solar cells.

The configuration of the solar cell interconnect incorporating the teachings of the present invention provides distinct advantages in terms of durability, repairability and survivability over prior art configurations of solar cell interconnects. Specifically, during thermal cycling of the solar cell array illustrated in FIG. 6, solar cells 44 and 54, and substrate 70 on which the solar cells are disposed, expand and contract in accordance with their respective coefficients of thermal expansion. Such expansion and contraction tends to decrease and increase, respectively, the distance D between adjacent sides of the solar cells 44 and 54.

To exemplify how the solar cell interconnect incorporating the teachings of the present invention reduces stress in the interconnect as compared to the high degree of stress occurring in typical prior art interconnects during similar thermal expansion and contraction, the following calculations were developed assuming typical dimensions for the prior art interconnect of FIG. 1, and for the interconnect incorporating the teachings of the present invention as illustrated in FIG. 6.

With reference to FIG. 1 the maximum stress in loop portion 12 of prior art interconnect 10 is given, approximately, by the following equation:

$S_{max} = E \times d \times (R_i^{-1} - R_f^{-1})$ where:

$S_{max}$ is the maximum stress in loop portion 12;
$R_i$ is the initial radius of loop portion 12;
$R_f$ is the radius of loop portion 12 at a temperature extreme;
E is the modulus of elasticity of the material comprising loop portion 12; and
d is half the thickness of the material of loop portion 12.

The value of $R_i$, which is roughly half the distance D between adjacent solar cells in a solar cell array, is governed by the need to place the solar cells as close to each other as practical to optimize utilization of space on the substrate carrying the array. Typically, $R_i$ is 0.20 mm on a spacecraft solar cell array. Assuming that the cells are on an aluminum substrate which is subjected to thermal cycling between −180° C. and +25° C., and that the intercell distance D is 0.51 mm, the intercell distance D will decrease by about 0.07 mm at the lower temperature extreme and $R_f$ will decrease by about .035 mm at the same temperature extreme. Therefore, the maximum stress seen in loop portion 12 is equal to $S_{max} = E \times d \times 1.06/mm.$ Comparing this to the stress induced in interconnects 30 as illustrated in the solar cell array of FIG. 6, where the solar cells of that array are also mounted on an aluminum substrate with an intercell spacing equal to 0.51 mm, and where the distance between proximal portion 46 of first connecting part 40 and proximal portion 56 of second connecting part 50 is equal to 0.4 cm, the decrease in intercell distance D caused by a temperature variation between −180° C. and +25° C. is equal to 0.07 mm. The maximum stress induced in stress relief part 32 is equal to:

$S_{max} = E \times d \times 0.0168/mm$

Thus, where the thickness of loop portion 12 of prior art interconnect 10 and the thickness of stress relief part 32 is identical, and where the materials comprising loop portion 12 and stress relief part 32 are the same, the stress induced in the interconnect incorporating the teachings of the present invention is reduced by over a factor of 60 (1.06/0.0168) as compared to the stress induced in loop portion 12 of prior art interconnect 10. This reduction in the maximum stress in the interconnect provides a great advantage in terms of the expected life of the interconnect.

Preferably, the first and second connecting parts 40 and 50, respectively, are formed of a material having a coefficient of thermal expansion substantially the same as the coefficient of thermal expansion of silicon since the solar cells are formed of silicon. In this manner, first and second connecting parts 40 and 50 expand and contract at the same rate during thermal cycling as do the solar cells to which they are connected. In this manner, stress concentrations in the connection of the first and second connecting parts to the electrical contacts of the first and second solar cells 44 and 54 is substantially eliminated. By way of example and not limitation, the first and second connecting parts may be formed of either molybdenum, INVAR, or KOVAR, all of which exhibit a coefficient of thermal expansion substantially the same as the coefficient of thermal expansion of silicon. INVAR as used herein describes a low thermal expansion coefficient nickel-iron alloy which may comprise a nickel-iron alloy consisting essentially of 36% nickel, 0.35% manganese, 0.12% to 0.3% silicon, 0.1% aluminum, 0.04% to 0.12% carbon, 0.015% phosphorus, and the balance iron. KOVAR as used herein defines a low thermal expansion coefficient nickel-iron-cobalt, 0.45% manganese, 0.1% silicon, 0.02% carbon and the balance iron.

Furthermore, to optimize the effectiveness the configuration of the interconnect incorporating the teachings of the present invention, stress relief part 32 may be formed of a material which is relatively strong at the temperature of the environment to which the solar cell interconnect will be exposed such that it can withstand repeated mechanical cycling. By way of example and not limitation, beryllium copper may be utilized as a material from which stress relief part 32 is formed.

Furthermore, because the interconnect incorporating the teachings of the present invention is formed in three distinct pieces, i.e., stress relief part 32, first connecting part 40, and second connecting part 50, the interconnect facilitates repairs since individual parts of the interconnect may be removed from the remaining parts of the interconnect when replacing a broken or damaged cell in the solar cell array. For instance, with respect to FIG. 6, if solar cell 44 is damaged and requires replacement, first connecting part 40 may be easily detached from stress relief part 32 and the entire solar cell 44 can be easily removed from the array. Thereafter, a new solar cell 44 having a new first connecting part 40 already attached to electrical contact 42 may be set in the array in place of the damaged cell, and easily joined to first end portion 36 of stress relief part 32 which remains in the array.

Additional advantages and modifications will readily occur to those skilled in the art. Therefore, the invention in its broader aspects is not limited to the specific details, representative devices, and illustrative examples shown and described. Accordingly, departures may be made from such details without departing from the spirit or scope of the general inventive concept as defined by the appended claims and their equivalents.

What is claimed is:

1. An interconnect for electrically connecting first and second solar cells, comprising:
   a stress relief part comprised of a single longitudinally extended member having a central portion with a planar surface and first and second end portions;
   a first connecting part for attachment to an electrical contact of said first solar cell;
   a second connecting part for attachment to an electrical contact of said second solar cell; and
   means for joining said first and second connecting parts to respective first and second end portions of said stress relief part such that said planar surface of said stress relief part is adapted to extend substantially parallel to adjacent edges of said first and second solar cells.

2. The interconnect of claim 1, wherein said first and second connecting parts each include distal and proximal portions, said proximal portions being detachably joined to respective first and second end portions of said stress relief part by said joining means, and said distal portions being configured to extend substantially perpendicularly from respective ones of said proximal portions of said first and second connecting parts in opposite directions relative to said stress relief part.

3. The interconnect of claim 1, wherein said central portion of said stress relief part has a predetermined length and is configured to be disposed and to extend substantially parallel to adjacent sides of the first and second solar cells which are to be electrically connected by the interconnect.

4. The interconnect of claim 1, wherein said first and second connecting parts are formed of a material having a coefficient of thermal expansion substantially the same as the coefficient of thermal expansion of silicon.

5. The interconnect of claim 1, wherein said first and second connecting parts are formed of a material selected from the group consisting of molybdenum, INVAR and KOVAR.

6. The interconnect of claim 1, wherein the joining means comprises solder-type bonds.

7. A solar cell array, comprising:
a plurality of solar cells arranged in an array, each said solar cell having an upper electrical contact and a lower electrical contact;
a plurality of interconnects for electrically connecting said solar cells, each said interconnect comprising:
a stress relief part comprised of a single longitudinally extended member having a central portion and first and second end portions defining a planar surface;
a first connecting part attached to the upper contact of a respective one of said solar cells;
a second connecting part attached to the lower contact of a solar cell adjacent to said respective one of said solar cells;
means for joining said first and second connecting parts to respective first and second end portions of said stress relief part such that said central portion of said stress relief part is disposed substantially parallel to adjacent edges of the solar cells which are electrically connected by the interconnect and such that said planar surface defined by said stress relief part extends substantially perpendicularly relative to the top surface of the solar cell array.

8. The solar cell array of claim 7, wherein said first and second connecting parts each include distal and proximal portions, said proximal portions being detachably joined to respective first and second end portions of said stress relief part by said joining means, and said distal portions being configured to extend substantially perpendicularly from respective ones of said proximal portions in opposite directions relative said stress relief part.

9. The solar cell array of claim 7 wherein said first and second connecting parts are formed of a material having a coefficient of thermal expansion substantially the same as the coefficient of thermal expansion of silicon.

10. The solar cell array of claim 7, wherein said first and second connecting parts are formed of a material selected from the group consisting of molybdenum, INVAR and KOVAR 11. The solar cell array of claim 7 wherein said joining means comprises solder-type bonds.

* * * * *